United States Patent
Ho et al.

(10) Patent No.: US 10,153,237 B2
(45) Date of Patent: Dec. 11, 2018

(54) CHIP PACKAGE AND METHOD FOR FORMING THE SAME

(71) Applicant: XINTEC INC., Taoyuan (TW)

(72) Inventors: Yen-Shih Ho, Kaohsiung (TW); Chia-Sheng Lin, Taoyuan (TW); Po-Han Lee, Taipei (TW); Wei-Luen Suen, New Taipei (TW)

(73) Assignee: XINTEC INC., Taoyuan (TW)

( * ) Notice: Subject to any disclaimer, the term of this patent is extended or adjusted under 35 U.S.C. 154(b) by 0 days.

(21) Appl. No.: 15/461,334

(22) Filed: Mar. 16, 2017

(65) Prior Publication Data

US 2017/0271276 A1    Sep. 21, 2017

Related U.S. Application Data

(60) Provisional application No. 62/311,287, filed on Mar. 21, 2016.

(51) Int. Cl.
| | | |
|---|---|---|
| H01L 23/00 | (2006.01) | |
| H01L 23/544 | (2006.01) | |
| H01L 23/58 | (2006.01) | |
| H01L 23/31 | (2006.01) | |

(52) U.S. Cl.
CPC ........ *H01L 23/562* (2013.01); *H01L 23/3114* (2013.01); *H01L 23/544* (2013.01); *H01L 23/585* (2013.01); *H01L 24/05* (2013.01); *H01L 24/11* (2013.01); *H01L 24/13* (2013.01); H01L 2223/5446 (2013.01); H01L 2224/0401 (2013.01); H01L 2224/05008 (2013.01); H01L 2224/13024 (2013.01)

(58) Field of Classification Search
CPC ... H01L 23/562; H01L 23/585; H01L 21/304; H01L 21/78; H01L 24/05; H01L 24/13; H01L 2223/5446; H01L 2223/0401; H01L 2224/0401; H01L 2224/05008; H01L 2224/13024; H01L 23/3114
USPC .......................................................... 257/620
See application file for complete search history.

(56) References Cited

U.S. PATENT DOCUMENTS

| | | | |
|---|---|---|---|
| 8,999,816 B1* | 4/2015 | Holden | H01L 21/78 438/113 |
| 2009/0140391 A1* | 6/2009 | Hou | H01L 23/562 257/620 |
| 2009/0146260 A1* | 6/2009 | Eto | H01L 23/585 257/620 |
| 2009/0149013 A1* | 6/2009 | Daubenspeck | H01L 23/5258 438/601 |
| 2009/0155982 A1* | 6/2009 | Wakisaka | H01L 21/561 438/462 |
| 2012/0025354 A1* | 2/2012 | Sasaki | H01L 21/561 257/620 |

(Continued)

*Primary Examiner* — Jami V Miller
(74) *Attorney, Agent, or Firm* — Liu & Liu

(57) ABSTRACT

A chip package including a substrate that has a first surface and a second surface opposite thereto is provided. The substrate includes a chip region and a scribe line region that extends along the edge of the chip region. The chip package further includes a dielectric layer disposed on the first surface of the substrate. The dielectric layer corresponding to the scribe line region has a through groove that extends along the extending direction of the scribe line region. A method of forming the chip package is also provided.

22 Claims, 8 Drawing Sheets

(56) References Cited

U.S. PATENT DOCUMENTS

| | | | |
|---|---|---|---|
| 2013/0062727 A1* | 3/2013 | Huang | H01L 23/3178 257/506 |
| 2013/0192078 A1* | 8/2013 | Yoshimi | H01L 22/12 33/701 |
| 2016/0204074 A1* | 7/2016 | Lin | H01L 21/784 257/76 |
| 2017/0271276 A1* | 9/2017 | Ho | H01L 23/544 |

* cited by examiner

CHIP PACKAGE AND METHOD FOR FORMING THE SAME

CROSS REFERENCE TO RELATED APPLICATIONS

This application claims the benefit of U.S. Provisional Application No. 62/311,287 filed on Mar. 21, 2016, the entirety of which is incorporated by reference herein.

BACKGROUND OF THE INVENTION

Field of the Invention

The invention relates to chip package technology, and in particular to a chip package having a protective structure with a low dielectric constant (low-k) material and methods for forming the same.

Description of the Related Art

Optoelectronic devices (such as image-sensing devices) play an important role in capturing images and have been widely used in electronic products such as digital cameras, digital video recorders, and mobile phones. The chip packaging process is an important step in the fabrication of electronic products. Chip packages not only protect the chips therein from outer environmental contaminants but also provide electrical connection paths between the electronic elements inside and those outside of the chip packages.

However, in the fabrication of a chip package having a sensor chip, one factor that can impact the reliability of the chip package is that cracks can form in low-k dielectric material (e.g., the insulating portion of the metallization/interconnection layer) in the chip package. For example, when the wafer is diced into individual chip packages, cracks may be formed in the low-k dielectric material in the chip package due to the stress caused by the dicing process. As a result, the reliability and performance of the chip package are reduced.

Thus, there exists a need in the art for the development of a chip package and methods for forming the same capable of eliminating or mitigating the aforementioned problems.

BRIEF SUMMARY OF THE INVENTION

An embodiment of the invention provides a chip package including a substrate having a first surface and a second surface opposite thereto. The substrate includes a chip region and a scribe line region extending along an edge of the chip region. The chip package further includes a dielectric layer disposed on the first surface of the substrate. The dielectric layer corresponding to the scribe line region includes a through groove therein and the through groove extends along the extending direction of the scribe line region.

An embodiment of the invention provides a method for forming a chip package, comprising providing a substrate having a first surface and a second surface opposite thereto. The substrate has a chip region and a scribe line region extending along an edge of the chip region. A dielectric layer is formed on the first surface of the substrate. A through groove is formed in the dielectric layer corresponding to the scribe line region, in which the through groove extends along an extending direction of the scribe line region.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

The making and using of the embodiments of the present disclosure are discussed in detail below. However, it should be noted that the embodiments provide many applicable inventive concepts that can be embodied in a variety of specific methods. The specific embodiments discussed are merely illustrative of specific methods to make and use the embodiments, and do not limit the scope of the disclosure. The disclosed contents of the present disclosure include all the embodiments derived from claims of the present disclosure by those skilled in the art. In addition, the present disclosure may repeat reference numbers and/or letters in the various embodiments. This repetition is for the purpose of simplicity and clarity, and does not imply any relationship between the different embodiments and/or configurations discussed. Furthermore, when a first layer is referred to as being on or overlying a second layer, the first layer may be in direct contact with the second layer, or spaced apart from the second layer by one or more material layers.

A chip package according to an embodiment of the present invention may be used to package micro-electro-mechanical system chips. However, embodiments of the invention are not limited thereto. For example, the chip package of the embodiments of the invention may be implemented to package active or passive devices or electronic components of integrated circuits, such as digital or analog circuits. For example, the chip package is related to optoelectronic devices, micro-electro-mechanical systems (MEMS), biometric devices, microfluidic systems, and physical sensors measuring changes to physical quantities such as heat, light, capacitance, pressure, and so on. In particular, a wafer-level packaging (WSP) process may optionally be used to package semiconductor chips, such as image-sensor elements, light-emitting diodes (LEDs), solar cells, RF circuits, accelerators, gyroscopes, fingerprint recognition devices, microactuators, surface acoustic wave devices, pressure sensors, ink printer heads, and so on.

The above-mentioned wafer-level packaging process mainly means that after the packaging step is accomplished during the wafer stage, the wafer with chips is cut to obtain individual packages. However, in a specific embodiment, separated semiconductor chips may be redistributed on a carrier wafer and then packaged, which may also be referred to as a wafer-level packaging process. In addition, the above-mentioned wafer-level packaging process may also be adapted to form a chip package having multi-layer integrated circuit devices by stacking (stack) a plurality of wafers having integrated circuits.

Figure 1A:
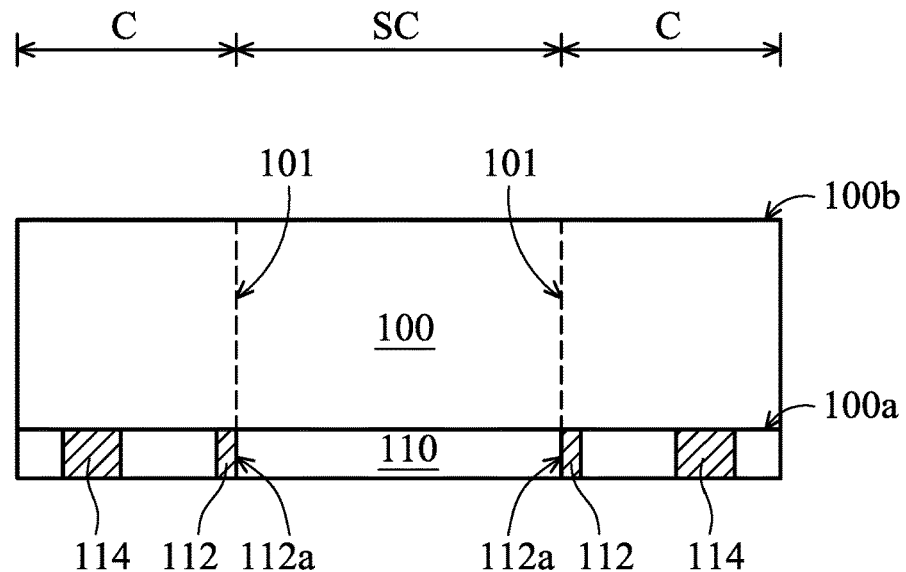
FIGS. 1A to 1I are cross-sectional views of an exemplary embodiment of a method for forming a chip package according to the invention.
Figure 1B:
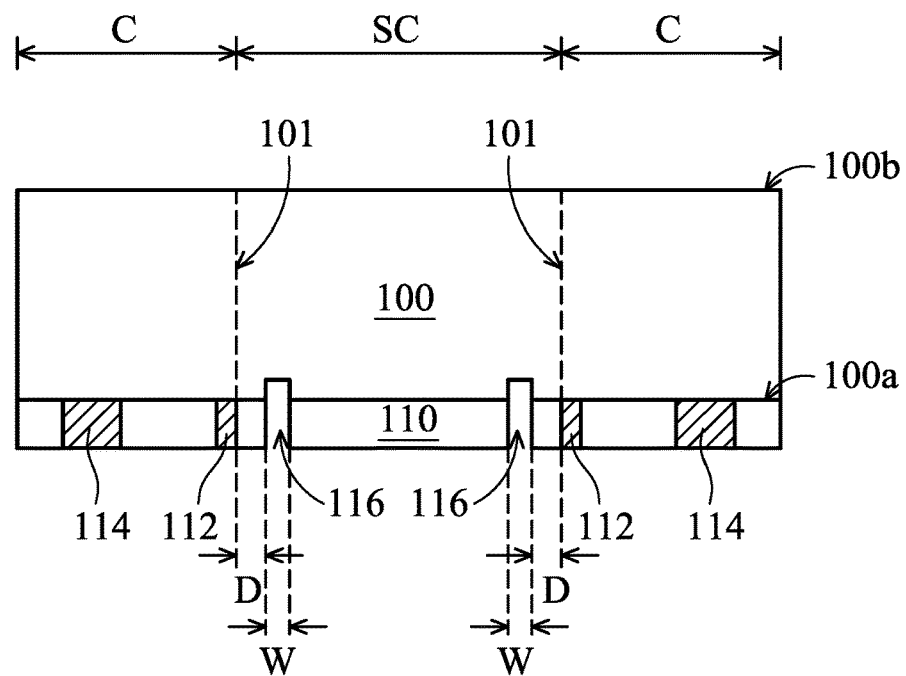
Figure 1C:
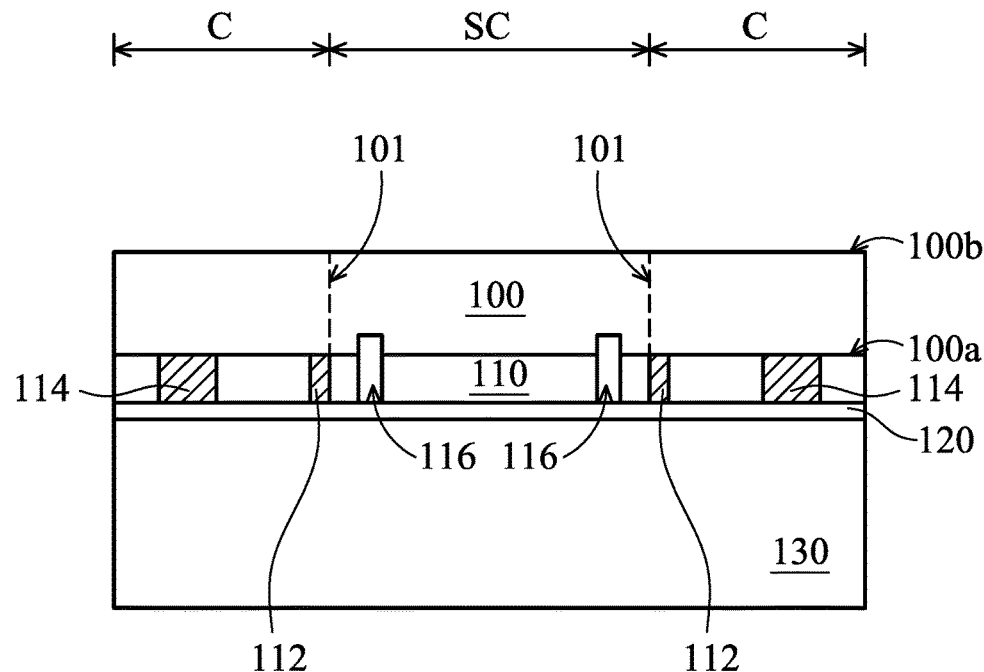
Figure 1D:
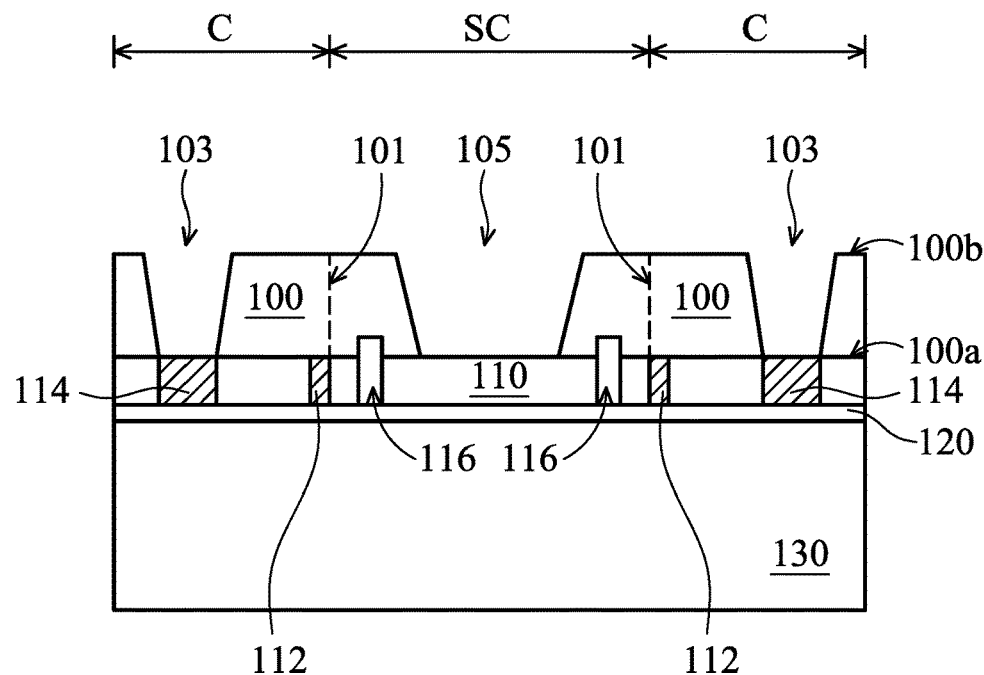
Figure 1E:
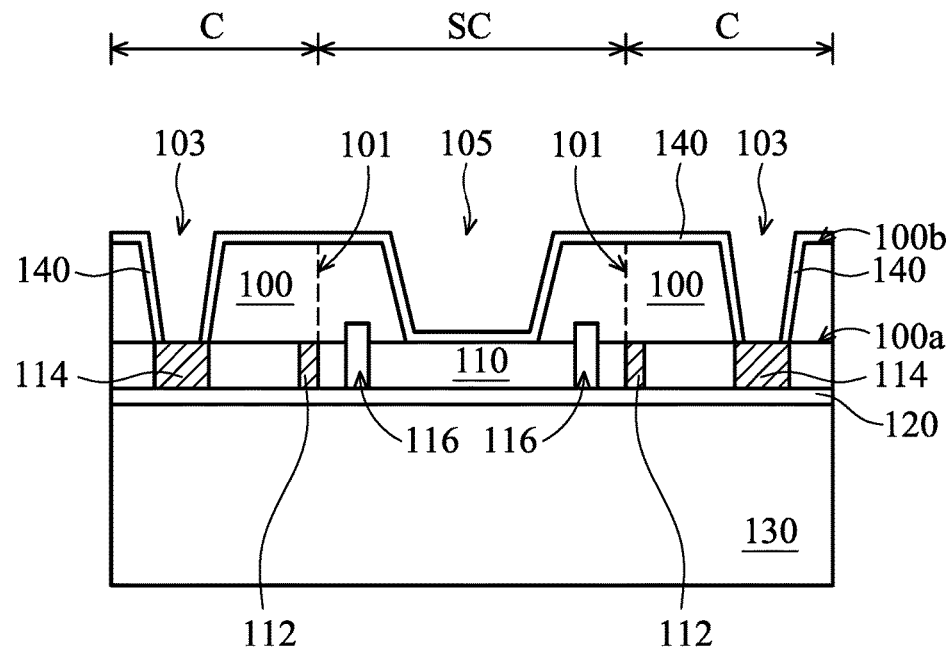
Figure 1F:
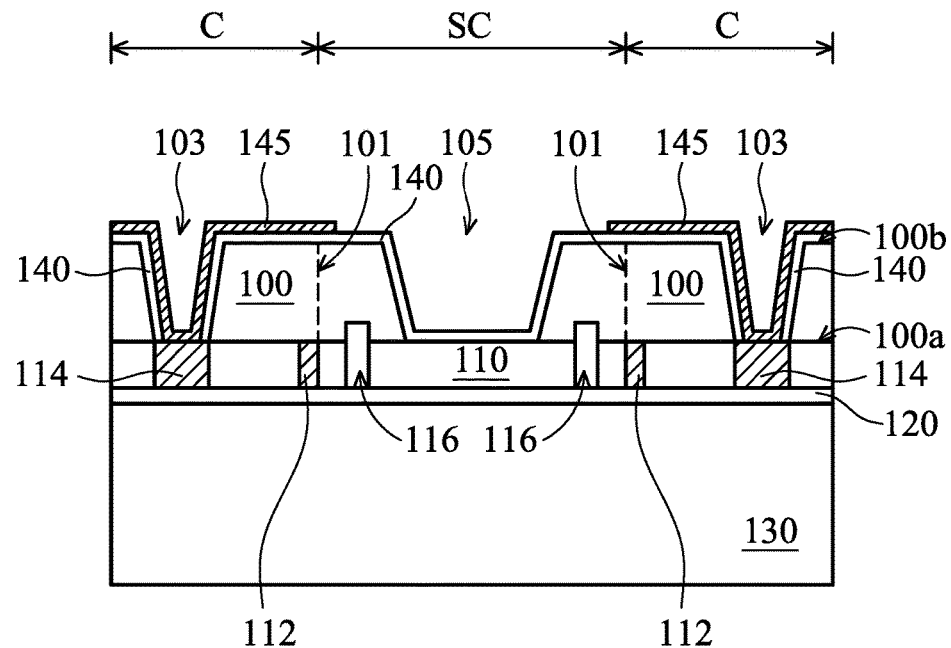
Figure 1G:
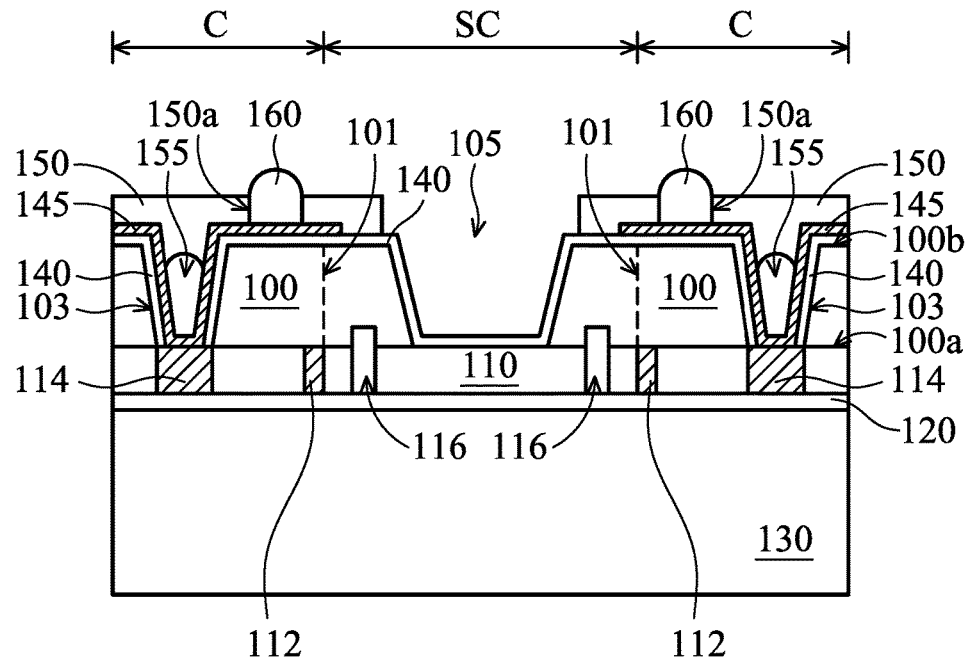
Figure 1H:
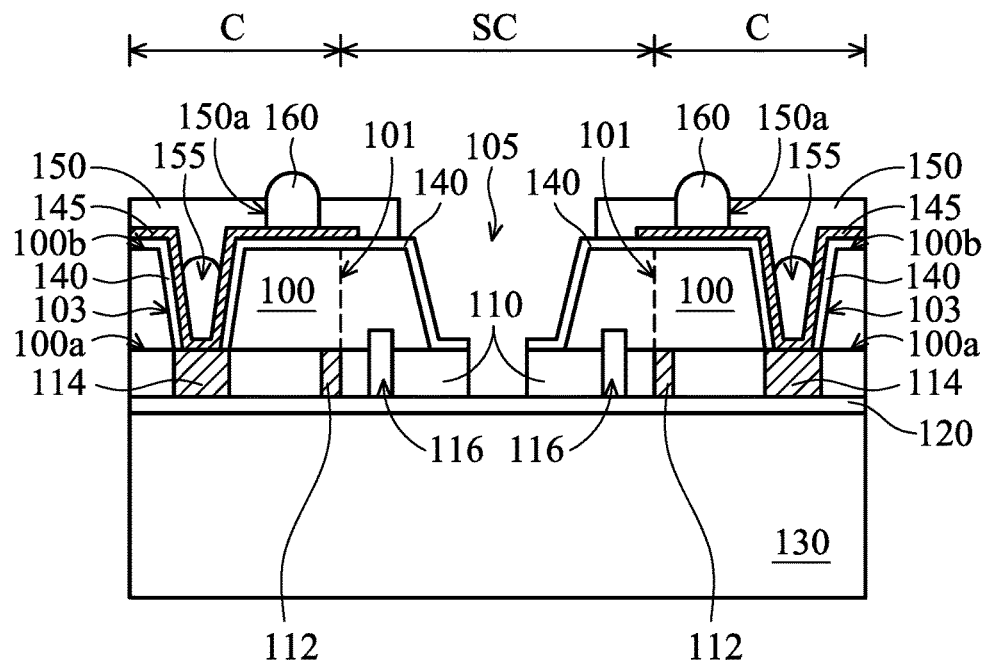
Figure 1I:
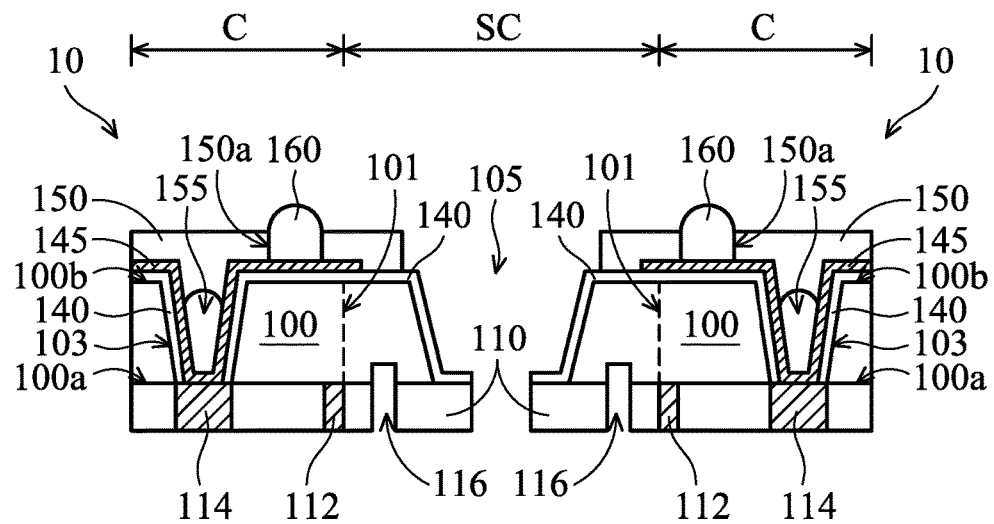
Figure 2:
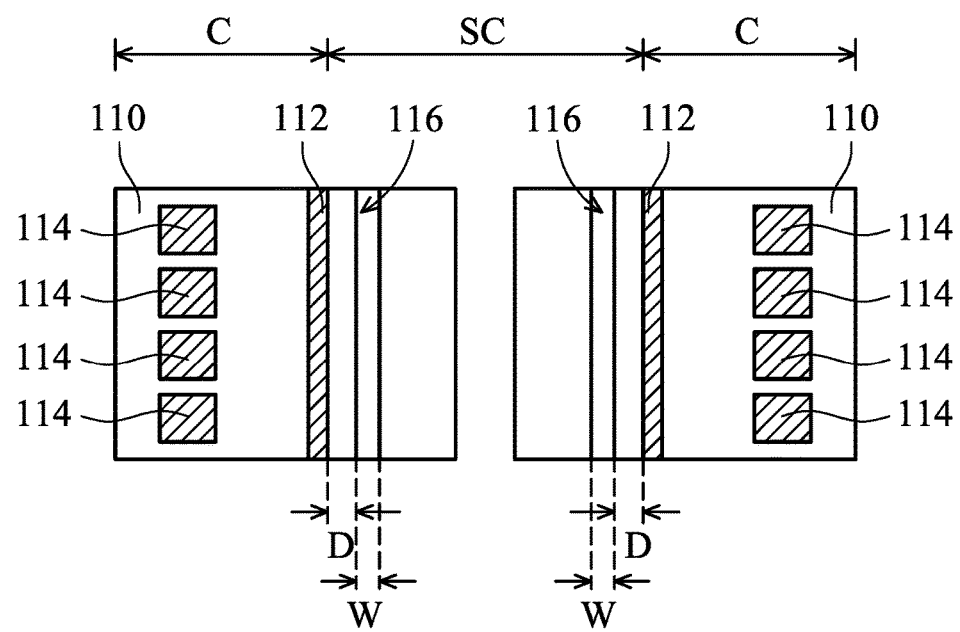
FIG. 2 is a partial bottom view of an exemplary embodiment of a dielectric layer in the chip package shown in FIG. 1I.

Referring to FIGS. 1I and 2, FIG. 1I is a cross-sectional view of an exemplary embodiment of a method for forming a chip package 10 according to the invention and FIG. 2 is a partial bottom view of an exemplary embodiment of a dielectric layer 110 in the chip package 10 shown in FIG. 1I. In the embodiment, the chip package 10 includes a substrate 100 and a metallization layer (or referred to as an interconnection layer) disposed on the substrate 100.

In one embodiment, the substrate 100 includes a silicon substrate or another semiconductor substrate. The substrate 100 has a first surface 100a and a second surface 100b opposite thereto. In one embodiment, the substrate 100 may be a silicon substrate or another semiconductor substrate. Moreover, the substrate 100 includes a chip region C and a scribe line region SC extending along the edge 101 (indicated by a dashed line) of the chip region C. Namely, the scribe line region SC surrounds the chip region C along the edge 101 of the chip region C (the edge 101 is also a boundary between the chip region C and the scribe line region SC). The chip region C may include a sensing device (not shown) therein and adjacent to the first surface 100a of the substrate 100. For example, the chip region C includes an image sensing device or another suitable sensing device. In other embodiments, the chip region C may include a biometrics sensing device (such as a fingerprint-recognition device), a sensing device which is configured to sense environmental characteristics (such as a temperature-sensing device, a humidity-sensing device, a pressure-sensing device or a capacitance-sensing device) or another suitable sensing device.

A metallization layer is disposed on the first surface 100a of the substrate 100. In general, the metallization layer includes an insulating portion and conductive features in the insulating portion. In the embodiment, the insulating portion of the metallization layer may include an interlayer dielectric (ILD) layer, an inter-metal dielectric (IMD) layer, a passivation layer, or a combination thereof. To simplify the diagram, only a single dielectric layer 110 is depicted herein. In one embodiment, the dielectric layer 110 may comprise a low dielectric constant material. In other embodiments, the dielectric layer 110 may comprise an inorganic material, such as silicon oxide, silicon nitride, silicon oxynitride, metal oxide, a combination thereof, or another suitable insulating material. Herein, the chip package 10 includes a chip/die, and the chip/die includes the substrate 100 and the dielectric layer 110.

In the embodiment, the dielectric layer 110 corresponding to the scribe line region SC has a through groove 116 therein and adjacent to the chip region C. In one embodiment, the through groove 116 penetrates the dielectric layer 110 to expose the first surface 100a of the substrate 100. In other embodiments, the through groove 116 penetrating the dielectric layer 110 further extends into the substrate 100 by a depth that is in a range of about 1 micrometer (μm) to 2 micrometers. In one embodiment, the through groove 116 has a width W (shown in FIG. 1B) that is in a range of about 2 micrometers to 15 micrometers. The through groove 116 extends along the extending direction of the scribe line region SC, as shown in FIG. 2. Namely, the through groove 116 also surrounds the chip region C along the edge 101 of the chip region C. In other embodiments, the through groove 116 may be entirely filled with an underfill material layer (not shown).

In the embodiment, the dielectric layer 110 disposed on the first surface 100a of the substrate 100 includes conductive features therein, such as a sealing ring 112 and one or more conductive pads 114, which correspond to the chip region C. In one embodiment, an edge 112a (shown in FIG. 1A) of the sealing ring 112 is substantially aligned to the boundary (i.e., the edge 101 of the chip region C) between the scribe line region SC and the chip region C. The sealing ring 112 extends along the extending direction of the scribe line region SC. Namely, the sealing ring 112 also surrounds the chip region C along the edge 101 of the chip region C. In one embodiment, the distance D (shown in FIG. 1B) between the through groove 116 and the sealing ring 112 is in a range of about 5 micrometers to 10 micrometers.

Moreover, the conductive pads 114 may be a single conductive layer or comprise multiple conductive layers. To simplify the diagram, conductive pads 114 comprising a single conducting layer are depicted herein as an example. In one embodiment, the sensing device in the chip region C may be electrically connected to the conductive pads 114 through interconnection structures (not shown) in the dielectric layer 110.

One or more openings 103 extend from the second surface 100b of the substrate to the first surface 100a of the substrate 100, so that the openings 103 pass through the substrate 100 and expose the corresponding conductive pads 114 that are adjacent to the first surface 100a of the substrate 100. In the embodiment, the width (or diameter) of the openings 103 adjacent to the second surface 100b is greater than that of the openings 103 adjacent to the first surface 100a. As a result, the openings 103 have inclined sidewalls.

Furthermore, an opening 150 extends along the sidewalls of the substrate 100 to surround the chip region C and pass through the substrate 100. In this case, the opening 105 has an inclined sidewall, that is, the substrate 100 has inclined edge sidewalls. In the embodiment, the top-view profile of the openings 103 is different from that of the opening 150. For example, the top-view profile of the openings 103 is circular while the top-view profile of the opening 105 is ring-shaped, such as rectangular ring-shaped. It should be realized that the top-view profiles of the openings 103 and the opening 105 may be another shape, and they are not limited thereto.

In the embodiment, the chip package 10 further includes an insulating liner 140 disposed on the second surface 100b of the substrate 100 and conformally extending to the sidewalls of the openings 103 and the sidewall and bottom of the opening 105. In one embodiment, the insulating liner 140 may comprise epoxy resin, inorganic materials (such as silicon oxide, silicon nitride, silicon oxynitride, metal oxide, or a combination thereof), organic polymer materials (such as polyimide, butylcyclobutene, parylene, polynaphthalenes, fluorocarbons or acrylates), or another suitable insulating material.

In the embodiment, the chip package 10 further includes a patterned redistribution layer 145 that is disposed on the insulating liner 140 over the second surface 100b of the substrate 100 and that conformally extends to the sidewall and the bottom of the openings 103. The redistribution layer 145 is electrically isolated from the substrate 100 via the insulating liner 140 and is in direct electrical contact with or indirectly electrically connected to the exposed conductive pads 114 through the openings 103. Therefore, the redistribution layer 145 in the openings 103 is also referred to as a through silicon via (TSV). In one embodiment, the redistribution layer 145 may comprise aluminum, copper, gold, platinum, nickel, tin, a combination thereof, a conductive polymer material, a conductive ceramic material (such as indium tin oxide or indium zinc oxide), or another suitable conductive material.

In the embodiment, the chip package 10 further includes a passivation layer 150 that is disposed on the second surface 100b of the substrate 100, and fills the openings 103 to cover the redistribution layer 145. In one embodiment, the passivation layer 150 may comprise epoxy resin, solder mask, inorganic materials (such as silicon oxide, silicon nitride, silicon oxynitride, metal oxide, or a combination thereof), organic polymer materials (such as polyimide, butylcyclobutene, parylene, polynaphthalenes, fluorocarbons or acrylates), or another suitable insulating material.

In the embodiment, the openings 103 are not fully filled with the passivation layer 150, so that a hole 155 is formed between the redistribution layer 145 and the passivation layer 150 within the openings 103. Therefore, the hole 155 can be a buffer between the redistribution layer 145 and the passivation layer 150 in thermal cycles induced in subsequent processes. Undesirable stress, which is induced between the redistribution layer 145 and the passivation layer 150 as a result of mismatch of thermal expansion coefficients, is reduced. The redistribution layer 145 is prevented from being excessively pulled by the passivation layer 150 when external temperature or pressure dramatically changes. As a result, problems such as peeling or disconnection of the redistribution layer 145, which is close to the conducting pad structure, are avoidable. In one embodiment, the interface between the passivation layer 150 and the hole 155 has an arcuate contour.

The passivation layer 150 on the second surface 100b of the substrate 100 has openings 150a exposing portions of the redistribution layer 145. Furthermore, a plurality of conducting structures 160 (such as solder balls, bumps or conductive pillars) are disposed in the openings 150a of the passivation layer 150 to electrically connect to the exposed redistribution layer 145. In one embodiment, the conducting structures 160 may comprise tin, lead, copper, gold, nickel, or a combination thereof.

Figure 3A:
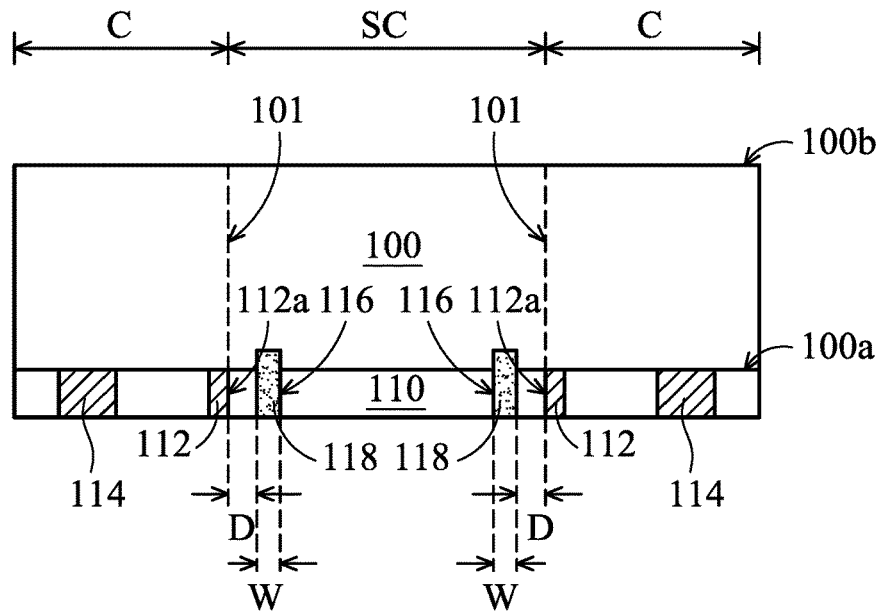
FIGS. 3A to 3E are cross-sectional views of another exemplary embodiment of a method for forming a chip package according to the invention.
Figure 3B:
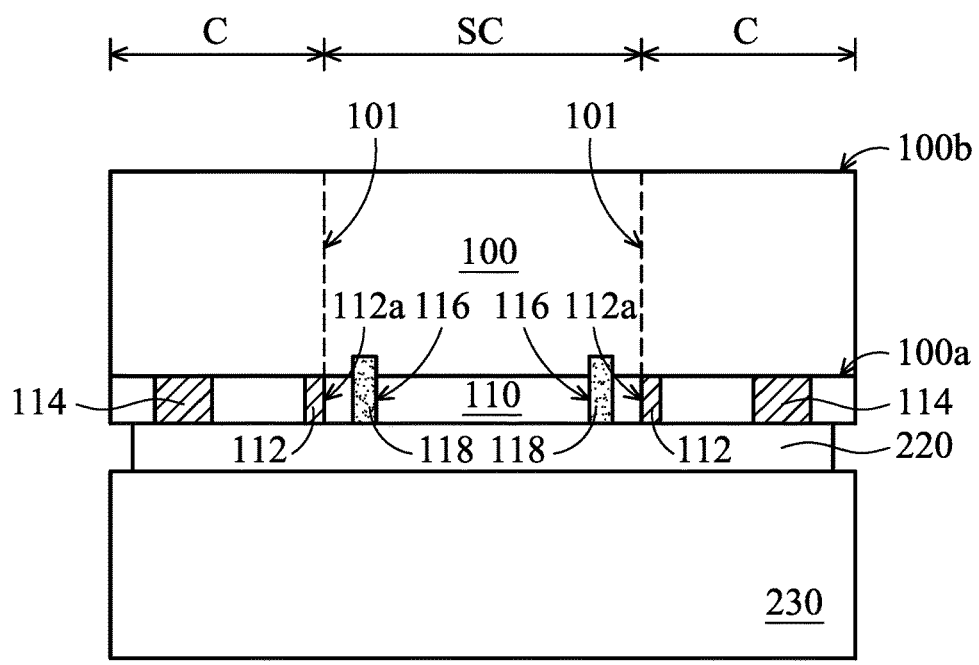
Figure 3C:
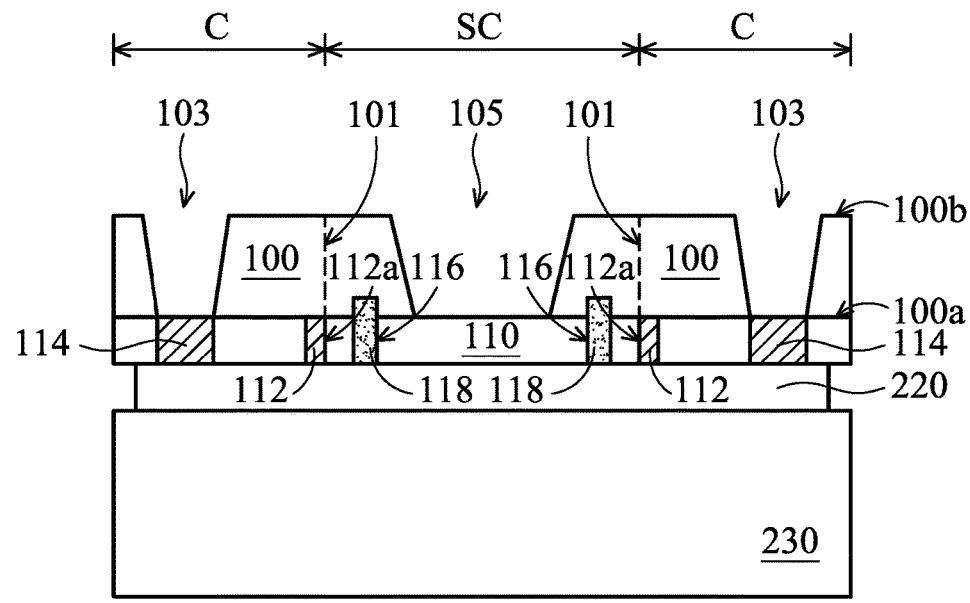
Figure 3D:
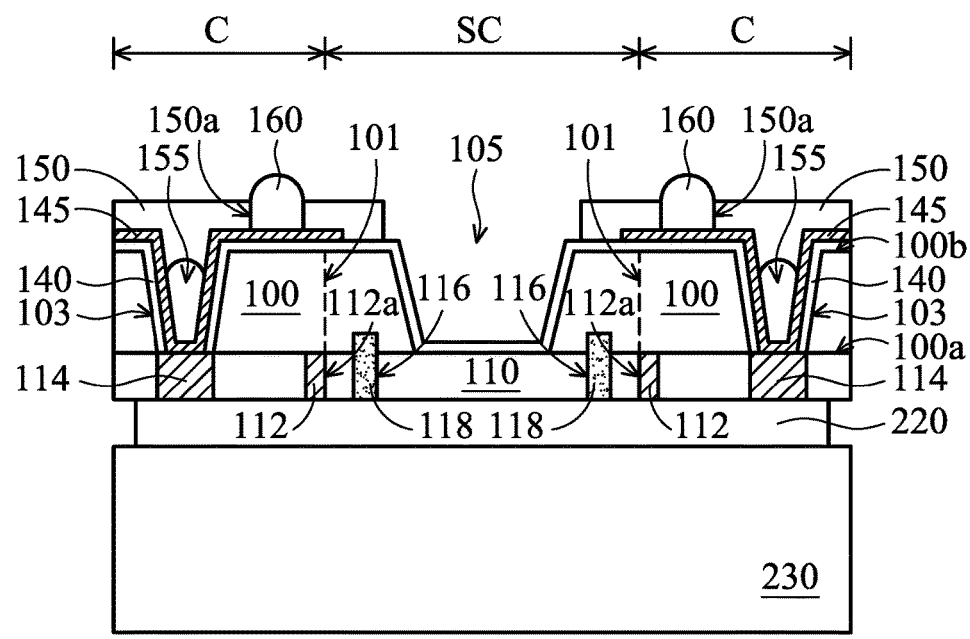
Figure 3E:
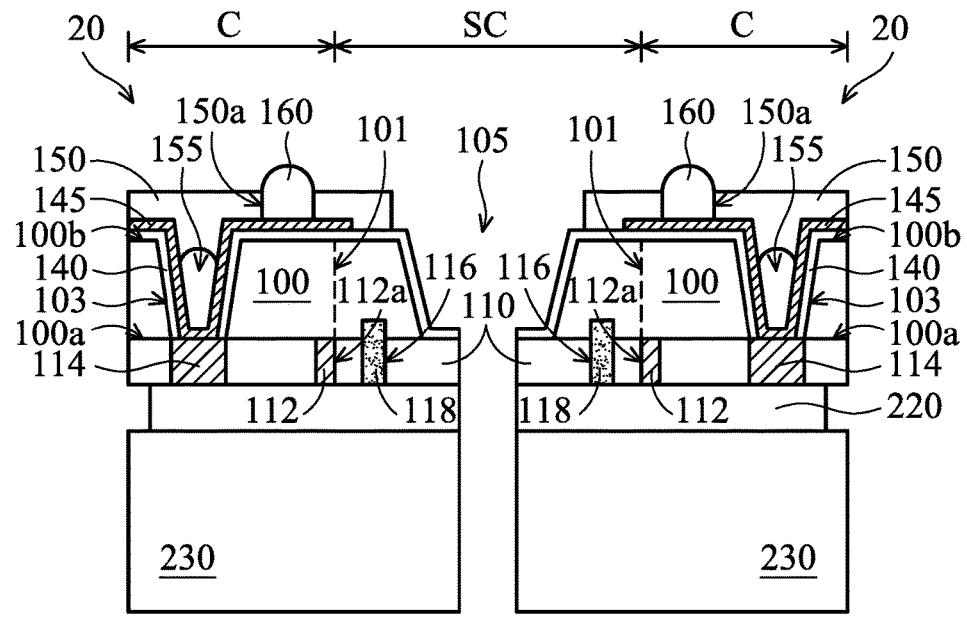
Figure 4:
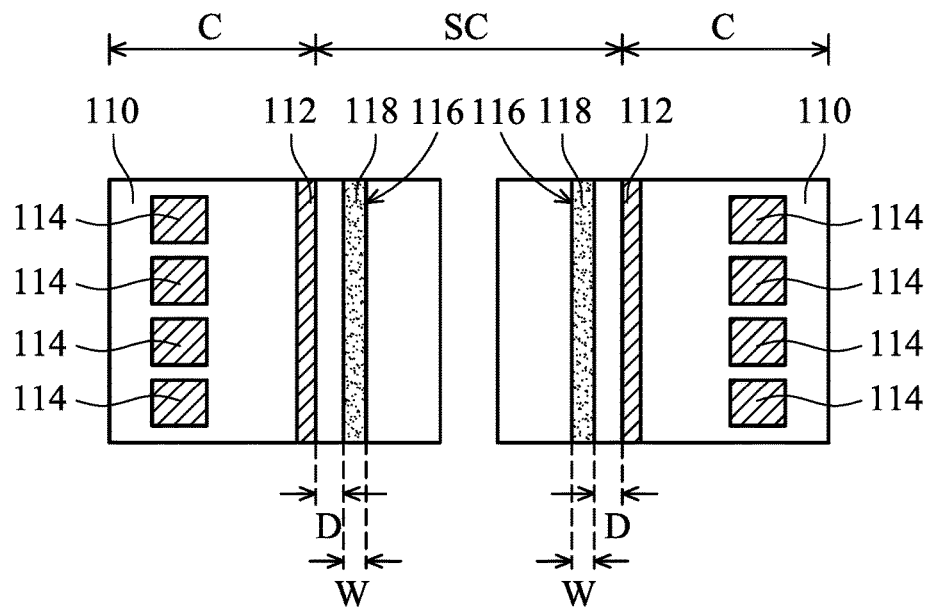
FIG. 4 is a partial bottom view of an exemplary embodiment of a dielectric layer in the chip package shown in FIG. 3E.

Referring to FIGS. 3E and 4, FIG. 3E is a cross-sectional view of another exemplary embodiment of a method for forming a chip package 20 according to the invention and FIG. 4 is a partial bottom view of an exemplary embodiment of a dielectric layer 110 in the chip package 20 shown in FIG. 4. Elements in FIGS. 3E and 4 that are the same as those in FIGS. 1I and 2 are labeled with the same reference numbers as in FIGS. 1I and 2 and are not described again for brevity. In the embodiment, the structure of the chip package 20 is similar to the structure of the chip package 10 in FIG. 1I.

In the embodiment, the through groove 116 in the chip package 20 is entirely filled with an underfill material layer 118. Moreover, the chip package 20 further includes a cover plate 230 and a spacer layer (or referred to as dam) 220. The cover plate 230 is disposed on the first surface 100a of the substrate 100. In the embodiment, the cover plate 230 may comprise glass, quartz, transparent polymer or another suitable transparent material.

The spacer layer 220 is disposed between the dielectric layer 110 and the cover plate 230 and covers the conductive pads 114. In the embodiment, the cover plate 230, the spacer layer 220 and the dielectric layer 110 together surround a cavity (not shown) on the chip region C so that the cavity corresponds to the sensing device of the substrate 100. In other embodiments, the spacer layer 220 covers the dielectric layer 110 corresponding to the sensing device of the substrate 100 so that there is no cavity between the cover plate 230 and the dielectric layer 110. In one embodiment, the spacer layer 160 does not substantially absorb moisture. In some embodiments, the spacer layer 220 does not substantially absorb moisture and is non-adhesive. In these cases, the cover plate 230 is attached on the dielectric layer 110 through an additional adhesive layer. In other embodiments, the spacer layer 220 may itself be adhesive. In these cases, the cover plate 230 can attach to the dielectric layer 110 by the spacer layer 220 so that the spacer layer 220 may contact none of the adhesion glue, thereby assuring that the spacer layer 220 will not move due to the disposition of the adhesion glue. In one embodiment, the spacer layer 220 may comprise epoxy resin, inorganic materials (such as silicon oxide, silicon nitride, silicon oxynitride, metal oxide, or a combination thereof), organic polymer materials (such as polyimide, butylcyclobutene (BCB), parylene, polynaphthalenes, fluorocarbons or acrylates), a photoresist material, or another suitable insulating material.

In the embodiments mentioned above, the chip packages 10 and 20 all comprise front side illumination (FSI) sensor devices. However, in other embodiments, the chip packages 10 and 20 may comprise back side illumination (BSI) sensor devices.

FIGS. 1A to 1I are cross-sectional views of an exemplary embodiment of a method for forming a chip package 10 according to the invention. Referring to FIG. 1A, a substrate 100 is provided. The substrate 100 has a first surface 100a and a second surface 100b opposite thereto. The substrate 100 may include a plurality of chip regions C and a scribe line region SC extending along the edge 101 (indicated by a dashed line) of each chip region C. To simplify the diagram, only a pair of incomplete chip regions C on both sides of the scribe line region SC is depicted herein. In one embodiment, the substrate 100 may be a silicon substrate or another semiconductor substrate. In another embodiment, the substrate 100 may be a silicon wafer so as to facilitate the wafer-level packaging process.

In the embodiment, each chip region C includes a sensing device (not shown) therein. The sensing device may be adjacent to the first surface 100a of the substrate 100. In one embodiment, the sensing device comprises an image sensing device, a biometrics sensing device (such as a fingerprint-recognition device), a sensing device which is configured to sense environmental characteristics (such as a temperature-sensing device, a humidity-sensing device, a pressure-sensing device or a capacitance-sensing device) or another suitable sensing device.

Next, a dielectric layer 110 is formed on the first surface 100a of the substrate 100. The dielectric layer 110 may be made of an ILD layer, IMD layer, a passivation layer, or a combination thereof. To simplify the diagram, only a flat layer is depicted herein. In one embodiment, the dielectric layer 110 may comprise an inorganic material, such as silicon oxide, silicon nitride, silicon oxynitride, metal oxide, another suitable insulating material, or a combination thereof.

Next, conductive features, such as a sealing ring 112 and one or more conductive pads 114, are formed in the dielectric layer 110 in the corresponding chip regions C. In one embodiment, an edge 112a of the sealing ring 112 is substantially aligned with the boundary (i.e., the edge 101 of the chip region C) between the scribe line region SC and the chip region C. Moreover, the sealing ring 112 extends along the extending direction of the scribe line region SC.

Furthermore, the conductive pads 114 may be a single conductive layer or comprise multiple conductive layers. To simplify the diagram, only conductive pads 114 comprising a single conductive layer are depicted herein as an example. In one embodiment, the sensing device in the chip region C may be electrically connected to the conductive pads 114 through interconnection structures (not shown) in the dielectric layer 110.

Referring to FIG. 1B, a through groove 116 is formed in the dielectric layer 110 corresponding to the scribe line region SC. The through groove 116 extends along the extending direction of the scribe line region SC and exposes the first surface 100a of the substrate 100. In other embodiments, the through groove 116 penetrating the dielectric layer 110 may extend further into the substrate 100 by a depth that is in a range of about 1 micrometer to 2 micrometers. In one embodiment, the through groove 116 is formed by a laser grooving process. In the embodiment, the through groove 116 is adjacent to the sealing ring 112 in the chip region C. For example, the distance D between the through groove 116 and the sealing ring 112 is in a range of about 5 micrometers to 10 micrometers. Moreover, the through groove 116 has a width W in a range of about 5 micrometers to 15 micrometers. In other embodiments, the through groove 116 may be entirely filled with an underfill material layer (not shown).

In the embodiment, the aforementioned structure may be fabricated by sequentially performing a front-end process (for example, the sensing device) is formed in the substrate 100) and a back-end process (for example, the dielectric layer 110, the interconnection structures, and the conductive pads 114 are formed on the substrate 100) on a semiconductor device. In other words, the following method for forming a chip package includes subsequent packaging processes performed on the substrate after the back-end process is finished.

Referring to FIG. 1C, the dielectric layer 110 is attached to a carrier substrate 130 (e.g., glass) via an adhesive layer (e.g., tape). Thereafter, a thinning process (such as an etching process, a milling process, a grinding process, or a polishing process) is performed on the second surface 100b of the substrate 100 to reduce the thickness of the substrate 100.

Afterwards, referring to FIG. 1D, openings 103 may be formed in the substrate 100 in each of the chip regions C and an opening 105 may be formed in the substrate 100 in the scribe line region SC by a lithography process and an etching process (such as a dry etching process, a wet etching process, a plasma etching process, a reactive ion etching process, or another suitable process). The openings 103 and the opening 105 extend to the first surface 100a of the substrate 100 from the second surface 100b of the substrate 100, so as to pass through the substrate 100 and expose the dielectric layer 110. In other embodiments, the openings 103 and the opening 105 may respectively be formed by a notching process and lithography and etching processes.

In the embodiment, the openings 103 correspond to the conductive pads 114, and the width (or diameter) of the openings 103 adjacent to the second surface 100b is greater than the width (or diameter) of the openings 103 adjacent to the first surface 100a. Therefore, the openings 103 have inclined sidewalls. The inclined sidewalls contribute to reducing the difficulty of the process for subsequently forming layers (e.g., the insulating layer and redistribution layer) in the openings 103, and the reliability of the chip package is improved. For example, since the diameter of the openings 103 adjacent to the first surface 100a is less than that of the openings 103 adjacent to the second surface 100b, layers subsequently formed in the openings 103 can be easily deposited on corners of the openings 103 to prevent these layers on the corners from fracturing.

In the embodiment, the opening 105 extends along the scribed line region SC between the adjacent chip regions C and penetrates the substrate 100, such that the substrate 100 in each of the chip regions C is separated from each other. The opening 105 has inclined sidewalls, so that the substrate 100 in each of the chip regions C has inclined edge sidewalls.

Next, referring to FIG. 1E, an insulating liner 140 is formed on the second surface 100b of the substrate 100 by a deposition process (such as a coating process, a physical vapor deposition process, a chemical vapor deposition process, or another suitable process). The insulating liner 140 conformally extends to the sidewalls and the bottoms of the openings 103 and the opening 105. In one embodiment, the insulating liner 140 may comprise epoxy resin, inorganic materials (such as silicon oxide, silicon nitride, silicon oxynitride, metal oxide, or a combination thereof), organic polymer materials (such as polyimide, butylcyclobutene, parylene, polynaphthalenes, fluorocarbons or acrylates) or another suitable insulating material. Afterwards, the insulating liner 140 on the bottom of the openings 103 is removed so as to expose the corresponding conductive pads 114.

Next, referring to FIG. 1F, a patterned redistribution layer 145 is formed on the insulating liner 140 over the second surface 100b of the substrate 100 by a deposition process (such as a coating process, a physical vapor deposition process, a chemical vapor deposition process, an electroplating process, an electroless plating process or another suitable process) and lithography and etching processes. The redistribution layer 145 conformally extends to the sidewalls and the bottoms of the openings 103. The redistribution layer 145 may be electrically isolated from the substrate 100 by the insulating liner 140 and in direct electrical contact with or indirectly electrically connected to the exposed conductive pads 114 through the openings 103. In one embodiment, the redistribution layer 145 may comprise aluminum, copper, gold, platinum, nickel, tin, a combination thereof, a conductive polymer material, a conductive ceramic material (such as indium tin oxide or indium zinc oxide), or another suitable conductive material.

Next, referring to FIG. 1G, a passivation layer 150 may be formed over the second surface 100b of the substrate 100 by a deposition process. The passivation layer 150 fills the openings 103 to cover the redistribution layer 145. In one embodiment, the passivation layer 150 may comprise epoxy resin, solder mask, inorganic materials (such as silicon oxide, silicon nitride, silicon oxynitride, metal oxide, or a combination thereof), organic polymer materials (such as polyimide, butylcyclobutene, parylene, polynaphthalenes, fluorocarbons or acrylates), or another suitable insulating material.

In the embodiment, the passivation layer 150 partially fills the openings 103, so that a hole 155 is formed between the redistribution layer 145 and the passivation layer 150 within the openings 103. In one embodiment, the interface between the passivation layer 150 and the hole 155 has an arcuate contour. In other embodiments, the first openings 103 may be fully filled with the passivation layer 150. Next, openings 150a may be formed in the passivation layer 150 on the second surface 100b of the substrate 100 by lithography and etching processes so as to expose portions of the redistribution layer 145.

Subsequently, conducting structures 160 (such as solder balls, bumps or conductive pillars) may be filled in the openings 150a of the passivation layer 150 by a electroplating process, a screen printing process, or another suitable process to electrically connect to the exposed redistribution layer 145. In one embodiment, the conducting structures 150a may comprise tin, lead, copper, gold, nickel, or a combination thereof.

Next, referring to FIG. 1H, the insulating liner 140 and the underlying dielectric layer 110 are successively diced from the bottom of the opening 105, thereby separating each of the chip regions C. For example, a dicing saw or laser may be used to perform the dicing process. In the embodiment, when the dielectric layer 110 is diced using the dicing saw, stress is generated in the dielectric layer 110 caused by the dicing saw. As a result, cracks (not shown) are formed in the dielectric layer 110. However, since the dielectric layer 110 has a through groove 116 therein, the cracks merely extend to the through groove 116 and do not extend further into the dielectric layer 110 corresponding to the chip region C.

After performing the dicing process, the adhesive layer 120 and the carrier substrate 130 are removed from the surface of the dielectric layer 110 so as to form individual chip packages 10, as shown in FIG. 1I.

It should be realized that although the embodiments of FIGS. 1A to 1I provide a method for forming a chip package with an FSI sensing device, the method for forming external electrical connection paths of the chip (such as the opening in the substrate, the redistribution layer, the protection layer, or the conducting structures therein) can be implemented with the processes of a BSI sensing device.

FIGS. 3A to 3E are cross-sectional views of another exemplary embodiment of a method for forming a chip package 20 according to the invention. Elements in FIGS. 3A to 3E that are the same as those in FIGS. 1A to 1I are labeled with the same reference numbers as in FIGS. 1A to 1I and are not described again for brevity. As shown in FIG. 3A, a structure as shown in the embodiment of FIG. 1B is provided. Next, the through groove 116 is entirely filled with an underfill material layer 118.

Next, referring to FIG. 3B, a cover plate 230 is provided. In the embodiment, the cover plate 230 may comprise glass, quartz, transparent polymer or another suitable transparent material. Afterwards, a spacer layer 220 is formed on the cover plate 230. The cover plate 230 is bonded onto the first surface 100a of the substrate 100 via the spacer layer 220. The spacer layer 220 forms a cavity (not shown) between the substrate 100 in the chip region C and the cover plate 230. In other embodiments, the spacer layer 220 is firstly formed on the dielectric layer 110 over the first surface 100a of the substrate 100, and then the cover plate 230 is bonded onto the substrate 100. In other embodiments, there is no cavity between the substrate 100 and the cover plate 230.

In one embodiment, the spacer layer 220 is formed by a deposition process (such as a coating process, a physical vapor deposition process, a chemical vapor deposition process or another suitable process). Moreover, the spacer layer 220 may comprise epoxy resin, inorganic materials (such as silicon oxide, silicon nitride, silicon oxynitride, metal oxide, or a combination thereof), organic polymer materials (such as polyimide, butylcyclobutene (BCB), parylene, polynaphthalenes, fluorocarbons or acrylates), or another suitable insulating material.

Next, referring to FIG. 3C, a thinning process is performed on the second surface 100b of the substrate 100 using the cover plate 230 as a carrier substrate to reduce the thickness of the substrate 100. Afterwards, openings 103 are formed in the substrate 100 in each of the chip regions C and an opening 105 is formed in the substrate 100 in the scribe line region SC by a lithography process and an etching process.

Next, referring to FIG. 3D, an insulating liner 140, a redistribution layer 145, a passivation layer 150, and conductive structures 160 in the openings 150a of the passivation layer 150 are successively formed on the structure shown in FIG. 3C by methods that are the same as or similar to those shown in the embodiments of FIGS. 1E to 1G.

Next, referring to FIG. 3E, the insulating liner 140, the dielectric layer 110, the spacer layer 220, and the cover plate 230 are successively diced from the bottom of the opening 105 to form individual chip packages 20. For example, a dicing saw or laser may be used to perform the dicing process. In the embodiment, when the dielectric layer 110 is diced using the dicing saw, stress is generated in the dielectric layer 110 caused by the dicing saw. As a result, cracks (not shown) are formed in the dielectric layer 110. However, since the dielectric layer 110 has a through groove 116 and an underfill material layer 118 therein, the cracks merely extend to the through groove 116 and do not extend further into the dielectric layer 110 corresponding to the chip region C.

It should be realized that although the embodiments of FIGS. 3A to 3E provide a method for forming a chip package with an FSI sensing device, the method for forming external electrical connection paths of the chip (such as the opening in the substrate, the redistribution layer, the protection layer, or the conducting structures therein) can be implemented with the processes of a BSI sensing device.

According to the aforementioned embodiments of the invention, since the through groove in the dielectric layer effectively prevents the cracks from extending further into the dielectric layer corresponding to the chip region, the reliability and performance of the chip package can be maintained or enhanced. Moreover, since the through groove can effectively prevent cracks from extending, there is no need to perform a pre-sawing process in the scribe line region and form a passivation layer on the sidewall of the substrate in the scribe line region to protect the dielectric layer. As a result, the adhesive layer and the carrier substrate formed on the dielectric layer can be removed smoothly. Moreover, the substrate warpage caused by the formation of the passivation layer on the sidewall of the substrate in the scribe line region can be prevented. Additionally, since there is no need to perform a pre-sawing process, the problem of shifting between the pre-sawing process and the dicing process will not exist.

While the invention has been disclosed in terms of the preferred embodiments, it is not limited. The various embodiments may be modified and combined by those skilled in the art without departing from the concept and scope of the invention.

What is claimed is:

1. A chip package, comprising:
   a semiconductor substrate having a first surface and a second surface opposite thereto, wherein the substrate comprises a chip region and a scribe line region extending along an edge of the chip region;
   a dielectric layer disposed on the first surface of the substrate, wherein the dielectric layer corresponding to the scribe line region comprises a through groove therein and the through groove extends along an extending direction of the scribe line region; and
   a sealing ring disposed in the dielectric layer, wherein an edge of the sealing ring is aligned with a boundary between the scribe line region and the chip region, and the sealing ring extends along the extending direction of the scribe line region.

2. The chip package as claimed in claim 1, wherein a distance between the through groove and the sealing ring is in a range of 5 micrometers to 10 micrometers.

3. The chip package as claimed in claim 1, wherein the through groove has a width that is in a range of 5 micrometers to 15 micrometers.

4. The chip package as claimed in claim 1, further comprising an underfill material layer to entirely fill the through groove.

5. The chip package as claimed in claim 4, further comprising:
- a cover plate disposed over the first surface of the substrate; and
- a spacer layer disposed between the dielectric layer and the cover plate.

6. The chip package as claimed in claim 1, further comprising:
- a conductive pad disposed in the dielectric layer and corresponding to the chip region;
- a redistribution layer disposed over the second surface of the substrate and extending into an opening in the substrate to electrically connect to the conductive pad;
- a passivation layer disposed over the second surface of the substrate and filling the opening in the substrate to cover the redistribution layer; and
- a conductive structure penetrating the passivation layer to electrically connect to the redistribution layer.

7. The chip package as claimed in claim 1, wherein the dielectric layer comprises a low dielectric constant material.

8. The chip package as claimed in claim 1, wherein the through groove extends into the substrate by a depth.

9. The chip package as claimed in claim 8, wherein the depth is in a range of 1 micrometer to 2 micrometers.

10. A method for forming a chip package, comprising:
- providing a semiconductor substrate having a first surface and a second surface opposite thereto, wherein the substrate comprises a chip region and a scribe line region extending along an edge of the chip region;
- forming a dielectric layer on the first surface of the substrate;
- forming a through groove in the dielectric layer corresponding to the scribe line region, wherein the through groove extends along an extending direction of the scribe line region; and
- forming a sealing ring in the dielectric layer, wherein an edge of the sealing ring is aligned with a boundary between the scribe line region and the chip region, and the sealing ring extends along the extending direction of the scribe line region.

11. The method for forming a chip package as claimed in claim 10, wherein a distance between the through groove and the sealing ring is in a range of 5 micrometers to 10 micrometers.

12. The method for forming a chip package as claimed in claim 10, wherein the through groove has a width that is in a range of 5 micrometers to 15 micrometers.

13. The method for forming a chip package as claimed in claim 10, wherein the through groove is formed by a laser grooving process.

14. The method for forming a chip package as claimed in claim 10, further comprising forming a conductive pad disposed in the dielectric layer corresponding to the chip region.

15. The method for forming a chip package as claimed in claim 11, further comprising entirely filling the through groove with an underfill material layer.

16. The method for forming a chip package as claimed in claim 15, further comprising:
- forming a spacer layer over the first surface of the substrate; and
- forming a cover plate over the spacer layer, such that the spacer layer is between the dielectric layer and the cover plate.

17. The method for forming a chip package as claimed in claim 14, further comprising:
- forming an opening in the substrate to expose the conductive pad;
- forming a redistribution layer over the second surface of the substrate and extending into the opening in the substrate to electrically connect to the conductive pad;
- forming a passivation layer over the second surface of the substrate and filling the opening in the substrate to cover the redistribution layer; and
- forming a conductive structure in the passivation layer to electrically connect to the redistribution layer.

18. The method for forming a chip package as claimed in claim 10, wherein the dielectric layer comprises a low dielectric constant material.

19. The method for forming a chip package as claimed in claim 10, wherein the through groove extends into the substrate by a depth.

20. The method for forming a chip package as claimed in claim 19, wherein the depth is in a range of 1 micrometer to 2 micrometers.

21. The chip package as claimed in claim 1, wherein both of opposite sidewalls of the through groove contact the first surface of the substrate.

22. The method for forming a chip package as claimed in claim 10, wherein both of opposite sidewalls of the through groove contact the first surface of the substrate.

* * * * *